United States Patent [19]

Murakami et al.

[11] Patent Number: 5,236,890
[45] Date of Patent: Aug. 17, 1993

[54] METHOD OF PRODUCING SUPERCONDUCTOR OF METAL OXIDES

[75] Inventors: Hirohiko Murakami, Koshigaya; Junya Nishino, Yokohama; Seiji Yaegashi, Urawa; Yu Shiohara; Shoji Tanaka, both of Tokyo, all of Japan

[73] Assignees: Kabushiki-Gaisha Arubakku Kohporehtosentah; Nippon Mining Co., Ltd.; Ishikawajima-Harima Jukogyo Kabushiki Kaisha; The International Superconductivity Technology Center, all of Japan

[21] Appl. No.: 606,921

[22] Filed: Oct. 31, 1990

[30] Foreign Application Priority Data

Nov. 13, 1989 [JP] Japan .................................. 1-295827

[51] Int. Cl.$^5$ ............................................. H01L 39/12
[52] U.S. Cl. ......................................... 505/1; 264/61; 427/62; 427/190; 501/12; 505/735; 505/737; 505/741
[58] Field of Search .................. 505/1, 734, 735, 739, 505/741, 725, 737, 738; 264/60, 61; 501/12; 427/62, 190

[56] References Cited

FOREIGN PATENT DOCUMENTS 2-030615  1/1990  Japan .

OTHER PUBLICATIONS

07/243518, Patent Abstracts of Japan, Dec. 13, 1990.
63-282120, Patent Abstracts of Japan, Mar. 14, 1989.
Kramer et al., *High Temperature Superconductors II* Apr. 1988.

*Primary Examiner*—Jan H. Silbaugh
*Assistant Examiner*—Christopher A. Fiorilla
*Attorney, Agent, or Firm*—Lorusso & Loud

[57] ABSTRACT

A method of producing a superconductor of metal oxides which includes subjecting an organic solvent solution containing (a) an alkoxide of a rare earth element, (b) an alkoxide of an alkaline earth metal and (c) copper alkoxide or cupric nitrate to hydrolysis in the presence of water and nitrate ions, thereby forming a mixture containing a gel-like substance. The gel-like substance is, after being dried and formed into a desired shape, pyrolyzed at a temperature of 600°–950°C. to form a superconductor of oxides of the rare earth, the alkaline earth metal and copper.

5 Claims, No Drawings

METHOD OF PRODUCING SUPERCONDUCTOR OF METAL OXIDES

BACKGROUND OF THE INVENTION

This invention relates to a method of producing a superconductor of metal oxides.

One known method for the production of a superconductor of metal oxides includes a step of dissolving a blend of alkoxides of the metals of the metal oxides in an organic solvent to provide a solution, a step of hydrolyzing the solution in the presence of water and hydrochloric acid to form a mixture containing a gel-like substance, a step of forming a shaped body using the mixture or dried powder thereof, and a step of pyrolyzing the shaped body to form a superconductor of the metal oxides (Japanese Tokkyo Kokai Nos. 63-256517, 63-257132, 63-259927 and 63-260819).

In the known method, carbonates of the metals are apt to be formed during the hydrolysis and pyrolysis stages. Since the carbonates have high decomposition temperatures and since a trace amount of the carbonates would cause reduction of the critical current of the resulting superconducting material, it is necessary to perform the pyrolysis at a high temperature in order to obtain superconductors with satisfactory properties.

SUMMARY OF THE INVENTION

It is, therefore, an object of the present invention to provide a method of producing a superconductor of metal oxides which does not yield by-products of metal carbonates.

Another object of the present invention is to provide a method which can yield carbonate-free, amorphous powder useful as a raw material for the production of superconductors.

In accomplishing the foregoing objects, there is provided in accordance with one aspect of the present invention a method of producing a superconductor of metal oxides, comprising the steps of:

subjecting an organic solvent solution containing (a) an alkoxide of a rare earth element, (b) an alkoxide of an alkaline earth metal and (c) copper alkoxide or cupric nitrates to hydrolysis in the presence of water and nitrate ions, thereby forming a mixture containing a gel-like substance;

removing the solvent from said mixture to obtain amorphous powder;

shaping said powder to form a shaped body; and pyrolyzing said shaped body at a temperature of 600°-950° C. to form a superconductor of oxides of the rare earth, the alkaline earth metal and copper.

In another aspect, the present invention provides a method of producing a superconductor of metal oxides, comprising the steps of:

subjecting an organic solvent solution containing (a) an alkoxide of a rare earth element, (b) an alkoxide of an alkaline earth metal and (c) copper alkoxide or cupric nitrate to hydrolysis in the presence of water and nitrate ions, thereby forming a mixture containing a gel-like substance;

shaping said mixture to form a shaped body;

drying said shaped body; and pyrolyzing said shaped body at a temperature of 600°-950° C. to form a superconductor of oxides of the rare earth, the alkaline earth metal and copper.

The present invention also provides a method of producing a precursor of a superconductor, comprising the steps of:

subjecting an organic solvent solution containing (a) an alkoxide of a rare earth element, (b) an alkoxide of an alkaline earth metal and (c) copper alkoxide or cupric nitrate to hydrolysis in the presence of water and nitrate ions, thereby forming a mixture containing a gel-like substance; and removing the solvent from said mixture to obtain amorphous powder as said precursor.

Other objects, features and advantages of the present invention will become apparent from the detailed description of the invention to follow.

DETAILED DESCRIPTION OF THE INVENTION

In the method according to the present invention, an organic solvent solution containing (a) one or more rare earth alkoxides, (b) one or more alkaline earth metal alkoxides and (c) copper alkoxide or cupric nitrate is first prepared.

As the rare earth element to be used in the ingredient (a), there may be used, for example, Y, La, Sc, Nd, Sm, Eu, Gd, Dy, Ho, Er, Yb and Lu. Examples of the alkaline earth metal to be used in the ingredient (b) include Ba, Sr and Ca. As the alcohol for the formation of the alkoxide group in the ingredients (a)-(c), monohydric alcohols such as methanol, ethanol, butanol and hexanol and dialcohols such as ethylene glycol and propylene glycol may be suitably used.

The organic solvent solution may be prepared by dissolving the ingredients (a)-(c) in a common solvent or by first dissolving respective ingredients (a)-(c) in different solvents and mixing the resulting solutions. The preferred method for the preparation of the organic solvent solution includes first dissolving the ingredients (a) and (b) in a solvent to form a first, homogeneous solution with which is then mixed a second solution containing cupric nitrate. This method is advantageous because cupric nitrate can provide nitrate ions and because the concentration of cupric nitrate in the second solution can be made high.

Illustrative of suitable organic solvents for the preparation of the organic solvent solution containing the ingredients (a)-(c) are ethanol, isopropanol, butanol, dioxane, tetrahydrofuran, benzene, toluene, xylene and ethylbenzene.

The contents and the kinds of the ingredients (a)-(c) are so determined as to provide the desired metal oxides. For example, when a superconductor of metal oxides $YBa_2Cu_3O_{7-x}$ is to be produced, an organic solvent solution containing an yttrium alkoxide, a barium alkoxide and cupric nitrate (or a copper alkoxide) and having contents of the yttrium and barium alkoxides of about 1 mole and 2 moles, respectively, per 3 moles of cupric nitrate (or copper alkoxide) is prepared.

The thus prepared organic solvent solution containing the ingredients (a)-(c) is then subjected to hydrolysis in the presence of water and nitrate ions, thereby forming a mixture containing a gel-like substance. The content of water in the reaction mixture to be hydrolyzed is generally 0.2-5 moles, preferably 0.5-2 mole, per mole of the total of ingredients (a)-(c). The content of nitrate ions in the reaction mixture to be hydrolyzed is generally 0.5-5 moles, preferably 1-2 moles per mole of the total of the ingredients (a)-(c). The nitrate ions and water may be provided by addition of aqueous nitric acid to the organic solvent solution or may be derived from $Cu(NO_3)_2 \cdot 3H_2O$ added as the ingredient (c). The hydrolysis is generally performed at a temperature from room temperature up to the boiling point of the organic solvent for a period of time sufficient to form a gel-like substance, generally 5-72 hours.

The mixture containing the gel-like substance is processed for the removal of the solvent therefrom to obtain amorphous powder. The removal of the solvent may be effected by any known method such as distillation at ambient or an elevated temperature under ambient or a reduced pressure. This powder whose primary particles generally have a particle size of 0.1 μm or less may be used as a raw material for the preparation of superconductors. Thus, the powder is shaped to form a shaped body which is then pyrolyzed at a temperature of 600°-950° C. to form a superconductor of oxides of the metals of the ingredients (a)-(c). The term "shaped body" used in the present specification and appended claims is intended to refer to wires, powders, filaments, fibers, plates, blocks, pipes, films, coatings and the like molded bodies and composite articles using these materials.

Alternatively, the mixture containing the gel-like substance is formed into a desired shaped body, which is then dried and pyrolyzed to form a superconductor. A molding aid formed of a polymeric substance such as carboxymethylcellulose or polyvinyl alcohol may be mixed with the gel-like substance-containing mixture.

When the gel-like substance-containing mixture or the amorphous powder obtained therefrom is used for the formation of coatings, it is applied over a surface of a substrate. The coated substrate is then heated to effect pyrolysis, thereby to give a composite article having a superconducting surface. The substrate may be formed of an elemental metal such as copper or silver; an alloy such as stainless steel; a metal oxide such as alumina, zirconia, magnesia or strontium titanate; a ceramic material such as silicon carbide; or graphite. The substrate may be in the form of a plate, a block, a coil, a fiber, a fabric, a pipe, a rod or the like shaped body.

The pyrolysis may be generally performed at a temperature of 500°-1,200° C., preferably 600°-950° C., more preferably 600°-800° C. Since, in the method according to the present invention, the formation of metal carbonates with high decomposition temperatures, such as alkaline earth metal carbonate, can be avoided, the pyrolysis is advantageously carried out at a relatively low temperature. Presumably, a portion of the nitrate ions is incorporated into the hydrolysis product to form an alkaline earth metal nitrate with a relatively low decomposition temperature. The nitrate ion thus bound to the alkaline earth metal would prevent the contact between carbonate ions and the alkaline earth metal and, hence, the formation of an alkaline earth metal carbonate during the course of the pyrolysis.

The method of the present invention is particularly suited for the production of superconductor of the following metal oxides:

$$AB_2Cu_3O_{7-x}$$

wherein A stands for a rare earth element, B stands for an alkaline earth metal, x is a number of 0-1, such as $YBa_2Cu_3O_{7-x}$, $HoBa_2Cu_3O_{7-x}$ and $GdBa_2Cu_3O_{7-x}$.

The following examples will further illustrate the present invention.

EXAMPLE 1

A solution obtained by dissolving 7 mmol of yttrium butoxide in 15 ml of xylene was homogeneously mixed with a solution obtained by dissolving 14 mmol of barium ethoxide in 200 ml of ethanol to obtain a mixed solution. In 150 ml of ethanol were dissolved 21 mmol of cupric nitrate ($Cu(NO_3)_2 \cdot 3H_2$) and this solution was mixed with the above mixed solution to obtain a raw material solution. The raw material solution which contained water in an amount of about 1.5 mol per mol of the total of the metals was then reacted at about 60° C. for 24 hours under reflux under a nitrogen gas stream with stirring, to obtain a hydrolyzed mixture containing a gel-like substance. This mixture was evaporated to dryness for the removal of the solvents with heating to obtain amorphous superfine powder.

The amorphous powder was dried with heating at 150° C. under vacuum for the removal of residual nitric acid and then heated to 650° C. at a heating rate of 1° C./minute under vacuum of 100 to $10^{-3}$ Pa, and maintained at that temperature for 10 hours. The calcined powder was further heated at 650° C. for 10 hours in the atmosphere of oxygen. The X-ray diffraction analysis of the resultant product reveals the formation of superconductor having $YBa_2Cu_3O_7$ crystal phase free of barium carbonate.

EXAMPLE 2

The amorphous powder obtained in Example 1 was dispersed in acetone and the dispersion was uniformly applied over a surface of MgO substrate. The coating was then calcined at 800° C. for 10 hours in the atmosphere of oxygen, thereby obtaining a composite article having a superconductor film having $YBa_2Cu_3O_7$ crystal phase.

EXAMPLE 3

The gel-like substance-containing mixture obtained in Example 1 was applied over a surface of MgO substrate and dried. The dried coating was then calcined at 800° C. for 10 hours in the atmosphere of oxygen, thereby obtaining a composite article having a superconductor film having $YBa_2Cu_3O_{7-x}$ crystal phase.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A method of producing a superconductor of metal oxides of the following formula:

$$AB_2Cu_3O_{7-x}$$

wherein A stands for a rare earth element, B stands for an alkaline earth metal, and x is a number of 0-1, said method comprising the steps of:
dissolving cupric nitrate trihydrate in ethanol to obtain a first solution;
providing a second, organic solution containing an alkoxide of said rare earth element and an alkoxide of said alkaline earth metal;

mixing said first solution with said second solution to obtain a mixed solution having a molar ratio of A:B:Cu of 1:2:3 and containing water in an amount of 1.5-2 moles per mole of the total of said cupric nitrate trihydrate, said rare earth element alkoxide and said alkaline earth metal alkoxide;

hydrolyzing said mixed solution to obtain a mixture containing a gel-like substance wherein the nitrate ions and water required for hydrolysis are derived from said cupric nitrate trihydrate;

removing the solvent from said mixture to obtain a carbonate free amorphous powder;

shaping said powder to form a shaped body; and pyrolyzing said shaped body at a temperature of 600° C. -950° C. to form said superconductor.

2. A method as set forth in claim 1, wherein said shaping step comprises coating said amorphous powder over a surface of a substrate to form said shaped body in the form of a coating.

3. A method of producing a superconductor of metal oxides of the following formula:

$AB_2Cu_3O_{7-x}$ wherein A stands for a rare earth element, B stands for an alkaline earth metal and x is a number of 0–1, said method comprising the steps of:

dissolving cupric nitrate trihydrate in ethanol to obtain a first solution;

providing a second, organic solution containing an alkoxide of said rare earth element and an alkoxide of said alkaline earth metal;

mixing said first solution with said second solution to obtain a mixed solution having a molar ratio of A:B:Cu of 1:2:3 and containing water in an amount of 1.5-2 moles per mole of the total of said cupric nitrate trihydrate, rare earth element alkoxide and said alkaline earth metal alkoxide;

hydrolyzing said mixed solution to obtain a mixture containing a gel-like substance, wherein the nitrate ions and water required for hydrolysis are derived from said cupric nitrate trihydrate;

shaping said mixture to form a carbonate free shaped body; drying said shaped body; and pyrolyzing said shaped body at a temperature of 600°-950° C. to form said superconductor.

4. A method as set forth in claim 3, wherein said shaping step comprises coating said mixture over a surface of a substrate to form said shaped body in the form of a coating.

5. A method of producing a precursor of a superconductor of metal oxides of the following formula:

$AB_2Cu_3O_{7-x}$ wherein A stands for a rare earth element, B stands for an alkaline earth metal and x is a number of 0–1, said method comprising the steps of:

dissolving cupric nitrate trihydrate in ethanol to obtain a first solution;

providing a second, organic solution containing an alkoxide of said rare earth element and an alkoxide of said alkaline earth metal;

mixing said first solution with said second solution to obtain a mixed solution having a molar ratio of A:B:Cu of 1:2:3 and containing water in an amount of 1.5-2 moles per mole of the total of said cupric nitrate trihydrate, said rare earth element alkoxide and said alkaline earth metal alkoxide;

hydrolyzing said mixed solution to obtain a mixture containing a gel-like substance, wherein the nitrate ions and water required for hydrolysis are derived from said cupric nitrate trihydrate; and removing the solvent from said mixture to obtain a carbonate free, amorphous powder as said precursor.

* * * * *